(12) United States Patent  
Birei

(10) Patent No.: US 10,797,717 B2
(45) Date of Patent: Oct. 6, 2020

(54) SIGNAL PROCESSING DEVICE AND TRANSCEIVER

(71) Applicant: ICOM INCORPORATED, Osaka (JP)

(72) Inventor: Tadamune Birei, Osaka (JP)

(73) Assignee: ICOM INCORPORATED, Osaka (JP)

(*) Notice: Subject to any disclaimer, the term of this patent is extended or adjusted under 35 U.S.C. 154(b) by 0 days.

(21) Appl. No.: 16/654,499

(22) Filed: Oct. 16, 2019

(65) Prior Publication Data

US 2020/0177196 A1 Jun. 4, 2020

(30) Foreign Application Priority Data

Nov. 30, 2018 (JP) .................................. 2018-225149

(51) Int. Cl.
| | |
|---|---|
| *H03M 1/18* | (2006.01) |
| *H03M 1/66* | (2006.01) |
| *H04B 1/10* | (2006.01) |
| *H03F 3/68* | (2006.01) |
| *H04L 27/26* | (2006.01) |

(52) U.S. Cl.
CPC ............. *H03M 1/18* (2013.01); *H03F 3/68* (2013.01); *H03M 1/66* (2013.01); *H04B 1/10* (2013.01); *H04L 27/2623* (2013.01); *H03F 2200/66* (2013.01)

(58) Field of Classification Search
CPC .. H03M 1/18; H03M 1/66; H03F 3/38; H04B 1/10; H04L 27/2623
USPC ........................... 341/130–155; 375/332, 344
See application file for complete search history.

(56) References Cited

U.S. PATENT DOCUMENTS

| | | | |
|---|---|---|---|
| 6,323,907 B1* | 11/2001 | Hwang | H04N 7/0135 |
| | | | 348/457 |
| 9,363,126 B2* | 6/2016 | Nangia | H04L 25/03159 |
| 9,837,990 B1* | 12/2017 | Pagnanelli | H03M 3/322 |
| 2009/0245437 A1* | 10/2009 | Furuta | H03H 17/0282 |
| | | | 375/344 |
| 2011/0069787 A1* | 3/2011 | Lee | H04L 27/0002 |
| | | | 375/322 |
| 2013/0201045 A1* | 8/2013 | Porret | H03M 3/50 |
| | | | 341/143 |

(Continued)

FOREIGN PATENT DOCUMENTS

| | | |
|---|---|---|
| JP | 7-45000 | 2/1995 |
| JP | 2003-99064 | 4/2003 |
| JP | 2008-236268 | 10/2008 |

*Primary Examiner* — Lam T Mai
(74) *Attorney, Agent, or Firm* — Ohlandt, Greeley, Ruggerio & Perle, L.L.P.

(57) ABSTRACT

A signal processing device includes an A-D converter and a controller. The A-D converter converts an analog signal to a digital signal in which portions where the amplitude exceeds a predetermined range are clipped. A counter of the controller calculates, for the digital signal, a number of clipped samples for each predetermined number of period samples. A frequency converter performs frequency conversion of the digital signal. An LPF removes high frequency components of the digital signal. A rate converter converts a sampling rate of the A-D converter. A digital amplifier amplifies and outputs the digital signal. An amplification factor adjuster multiplies a preset amplification factor of the digital amplifier by an amplification factor adjustment coefficient based on a ratio of the number of regular samples to the number of period samples, to adjust the amplification factor.

8 Claims, 8 Drawing Sheets

(56) References Cited

U.S. PATENT DOCUMENTS

| | | | |
|---|---|---|---|
| 2014/0043177 A1* | 2/2014 | Pagnanelli | H03M 1/0836 |
| | | | 341/143 |
| 2014/0340161 A1* | 11/2014 | Canard | H03L 7/093 |
| | | | 331/16 |
| 2017/0170838 A1* | 6/2017 | Pagnanelli | H03F 3/2175 |
| 2019/0238152 A1* | 8/2019 | Pagnanelli | H03M 3/502 |
| 2020/0153406 A1* | 5/2020 | Quan | H03G 11/08 |

* cited by examiner

FREQUENCY SPECTRUM OF UNCLIPPED COMPOSITE WAVE
CONSTITUTED BY TARGET WAVE AND INTERFERENCE WAVE

FREQUENCY SPECTRUM OF CLIPPED COMPOSITE WAVE
CONSTITUTED BY TARGET WAVE AND INTERFERENCE WAVE

FIG. 9

NUMBER OF PERIOD SAMPLES P = 50

| NUMBER OF CLIPPED SAMPLES C | AMPLIFICATION FACTOR ADJUSTMENT COEFFICIENT |
|---|---|
| 0 | 50/50 |
| 1 | 50/49 |
| 2 | 50/48 |
| ⋮ | ⋮ |
| 32 | 50/18 |
| 33 | 50/17 |
| 34 | 50/16 |
| ⋮ | ⋮ |

SIGNAL PROCESSING DEVICE AND TRANSCEIVER

CROSS-REFERENCE TO RELATED APPLICATION

This application claims the benefit of Japanese Patent Application No. 2018-225149, filed on Nov. 30, 2018, the entire disclosure of which is incorporated by reference herein.

FIELD

The present disclosure relates generally to a signal processing device and a transceiver.

BACKGROUND

In cases where a target wave and an interference wave stronger than the target wave are simultaneously input into an analog-to-digital (A-D) converter of a transceiver and the amplitude of the composite wave constituted by the target wave and the interference wave exceeds the range determined by the A-D converter, portions of the input signal where the amplitude exceeds the predetermined range are clipped. When the input signal is clipped, the level of the target wave declines. In communication using an amplitude modulation method such as amplitude modulation (AM) or singe-sideband (SSB), information is transmitted by changing the amplitude of the radio waves. Accordingly, declines in the level of the target wave affect the communication. Due to this, there is a need to compensate for the level decline of the target wave of the clipped signal.

Unexamined Japanese Patent Application Kokai Publication No. H07-45000 discloses a digital audio sound playback device that suppresses clipping by adding negative offset voltage to portions of the waveform input into the A-D converter that exceed a predetermined range. Unexamined Japanese Patent Application Kokai Publication No. 2008-236268 discloses a clipping suppression device that suppresses clipping by extracting clipped portions of a series of input speech signals, smoothing the extracted portions, and adding the reverse phase of the smoothed signals to the speech signals. Unexamined Japanese Patent Application Kokai Publication No. 2003-099064 discloses a waveform correction method that includes interpolating and repairing a clipped portion of a recorded waveform.

SUMMARY

A signal processing device according to a first aspect of the present disclosure includes:
 an A-D converter that converts an analog signal that is input into the signal processing device to a digital signal in which portions where an amplitude exceeds a predetermined range are clipped, and outputs the digital signal; and
 a controller that includes
 a counter that calculates, for the digital signal output by the A-D converter, a number of clipped samples for each predetermined number of period samples;
 a frequency converter that performs frequency conversion of the digital signal output by the A-D converter;
 a filter that removes unnecessary signal components of the digital signal that is subjected to the frequency conversion by the frequency converter;
 a rate converter that converts a sampling rate of the A-D converter to a sampling rate that is an integer multiple of a value obtained by dividing by the number of period samples;
 a digital amplifier that amplifies the digital signal for which the rate converter has converted the sampling rate, and outputs the digital signal that is amplified; and
 an amplification factor adjuster that multiplies a preset amplification factor of the digital amplifier by an amplification factor adjustment coefficient, based on a ratio of the number of clipped samples to the number of period samples, to adjust the amplification factor of the digital amplifier.

It is preferable that the amplification factor adjuster sets, as the amplification factor adjustment coefficient, a value obtained by dividing the number of period samples by a number of regular samples, which are unclipped.

It is preferable that:
 when a value obtained by dividing the number of period samples by a number of regular samples that are unclipped is less than a threshold, the amplification factor adjuster sets, as the amplification factor adjustment coefficient, the value obtained by dividing the number of period samples by the number of regular samples, and
 when the value obtained by dividing the number of period samples by the number of regular samples is greater than or equal to the threshold, the amplification factor adjuster sets the threshold as the amplification factor adjustment coefficient.

It is preferable that:
 when a value obtained by dividing the number of period samples by a number of regular samples that are unclipped is less than a threshold, the amplification factor adjuster sets, as the amplification factor adjustment coefficient, the value obtained by dividing the number of period samples by the number of regular samples, and
 when the value obtained by dividing the number of period samples by the number of regular samples is greater than or equal to the threshold, the amplification factor adjuster sets, as the amplification factor adjustment coefficient, a value that gradually increases from the threshold as the value obtained by dividing the number of period samples by the number of regular samples increases.

A transceiver according to a second aspect of the present disclosure includes:
 any one of the signal processing devices;
 an antenna that receives an analog signal and inputs the analog signal into the signal processing device;
 a D-A converter that converts a digital signal, that is output by the signal processing device, to an analog signal;
 an analog amplifier that amplifies the analog signal that is converted by the D-A converter; and
 an output device that outputs the analog signal that is amplified by the analog amplifier.

According to the present disclosure, the amplification factor of the digital signal is adjusted on the basis of the ratio of the number of clipped samples of the digital signal that is converted by the A-D converter. As a result, it is possible to compensate for the level decrease of the target wave included in the clipped signal.

BRIEF DESCRIPTION OF THE DRAWINGS

A more complete understanding of this application can be obtained when the following detailed description is considered in conjunction with the following drawings, in which:

FIG. 9 is a drawing illustrating an example of an amplification factor adjustment coefficient table;

DETAILED DESCRIPTION

Figure 1:
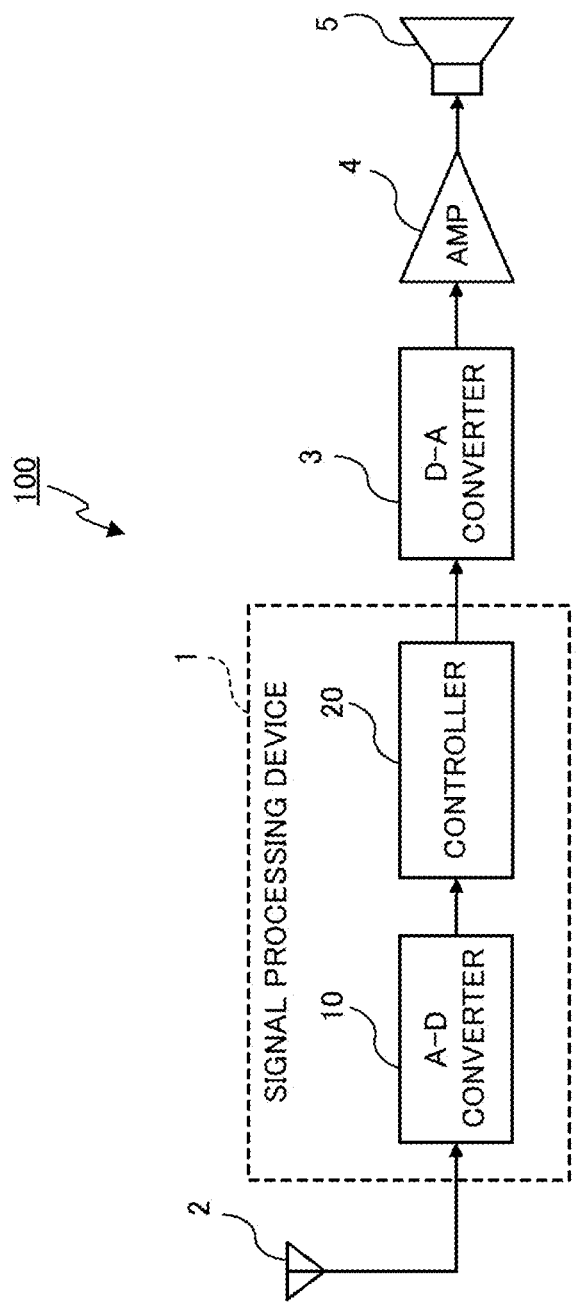
FIG. 1 is a block diagram illustrating a configuration example of a transceiver according to an embodiment of the present disclosure.

The technologies disclosed in Unexamined Japanese Patent Application Kokai Publication No. H07-45000 and Unexamined Japanese Patent Application Kokai Publication No. 2008-236268 suppress clipping by processing unclipped signals, and do not include the compensation of clipped signals. While the technology disclosed in Unexamined Japanese Patent Application Kokai Publication No. 2003-099064 includes the compensation of clipped signals, this technology recovers the clipped portions from the unclipped portion by predicting. As such, in most cases, signals of frequency components that have weak levels, such as the target waves that are combined with strong interference waves, are not restored. Accordingly, when the technology of Patent Literature 3 is applied to a transceiver, level decreases of target waves of clipped signals are not compensated for.

The present disclosure is made with the view of the above situation, and an objective of the present disclosure is to compensate for the level decrease of the target wave included in a signal that is clipped by an A-D converter.

Hereinafter, embodiments of the present disclosure are described in detail while referencing the drawings. Note that, in the drawings, identical or equivalent components are marked with the same reference numerals.

FIG. 1 is a block diagram illustrating a configuration example of a transceiver according to an embodiment of the present disclosure. A transceiver 100 includes an antenna 2, a signal processing device 1 that processes signals received by the antenna 2, a D-A converter 3 that digital-to-analog (D-A) converts the signals that are processed by the signal processing device 1, an analog amplifier 4 that amplifies the signals that are D-A converted by the D-A converter 3, and a speaker 5 that outputs the signals that are amplified by the analog amplifier 4. The speaker 5 is an example of an output device. The signal processing device 1 includes an A-D converter 10 that A-D converts analog signals that are received by the antenna 2, and a controller 20 that processes the digital signals that are A-D converted by the A-D converter 10.

The A-D converter 10 A-D converts analog signals that are received by the antenna 2. At this time, if the amplitude of the analog signal exceeds a predetermined range, a digital signal, in which portions where the amplitude exceeds the predetermined range are clipped, is output from the A-D converter 10. The A-D converter 10 outputs the converted digital signal to the controller 20. The controller 20 performs processing, on the digital signal to be input, in order to compensate for level decreases of the target wave that are caused by the digital signal being clipped. The controller 20 outputs the processed digital signal to the D-A converter 3. The controller 20 can be constituted in part or in whole by a digital signal processor (DSP) or in part or in whole by a field programmable gate array (FPGA). The controller 20 may also be constituted by a system on chip (SoC) that includes a CPU. In the example of FIG. 1, only the receiving function of the transceiver 100 is illustrated, but the transceiver 100 may also include a sending function. Next, the processing performed by the signal processing device 1 is described in detail while referencing FIG. 2.

Figure 2:
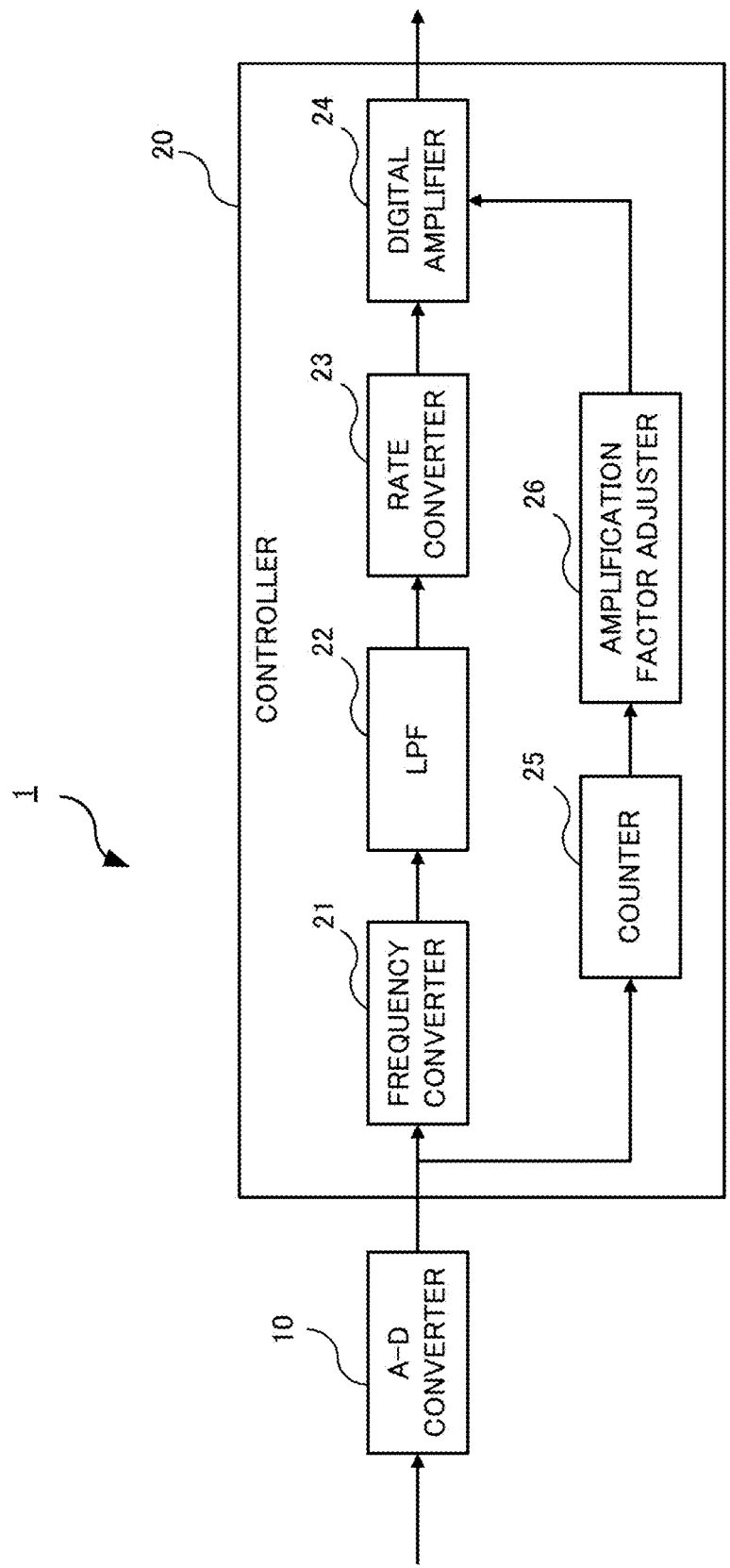
FIG. 2 is a block diagram illustrating a functional configuration example of a signal processing device according to an embodiment.

FIG. 2 is a block diagram illustrating a functional configuration example of the signal processing device according to an embodiment. The A-D converter 10 of the signal processing device 1 converts the analog signal to be input to a digital signal and outputs this digital signal to the controller 20. The range of signal amplitudes that the A-D converter 10 can handle is determined. However, the antenna 2 receives both target waves and interference waves and, as a result, the amplitude of the analog signal received by the antenna 2 may exceed the predetermined range of the A-D converter 10. In such a case, portions of the analog signal, that is input into the A-D converter 10 from the antenna 2, where the amplitude exceeds the predetermined range are clipped. Next, the clipping of the analog signal is described using FIGS. 3 to 8.

Figure 3:
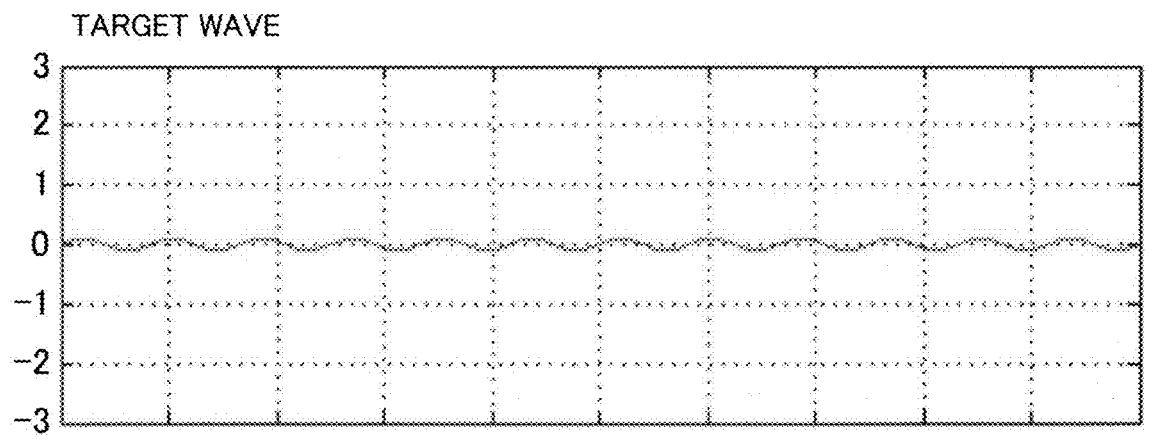
FIG. 3 is a drawing illustrating an example of a target wave.
Figure 4:
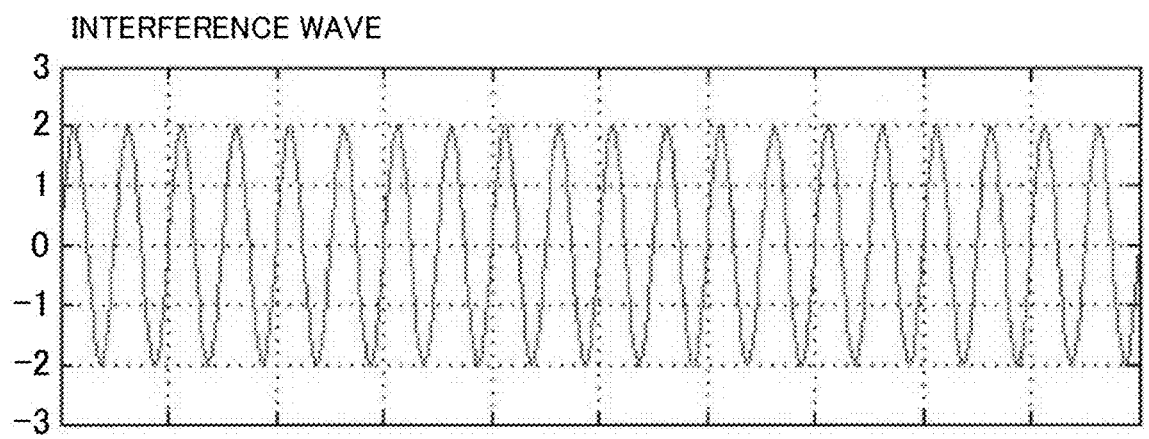
FIG. 4 is a drawing illustrating an example of an interference wave.

FIG. 3 is a drawing illustrating an example of the target wave. FIG. 4 is a drawing illustrating an example of the interference wave. In the examples of FIGS. 3 and 4, the range of signal amplitudes that the A-D converter 10 can handle is set to a range from −1 to 1. The amplitude of the target wave illustrated in FIG. 3 is within the range from −1 to 1, but the amplitude of the interference wave illustrated in FIG. 4 is outside the range from −1 to 1.

Figure 5:
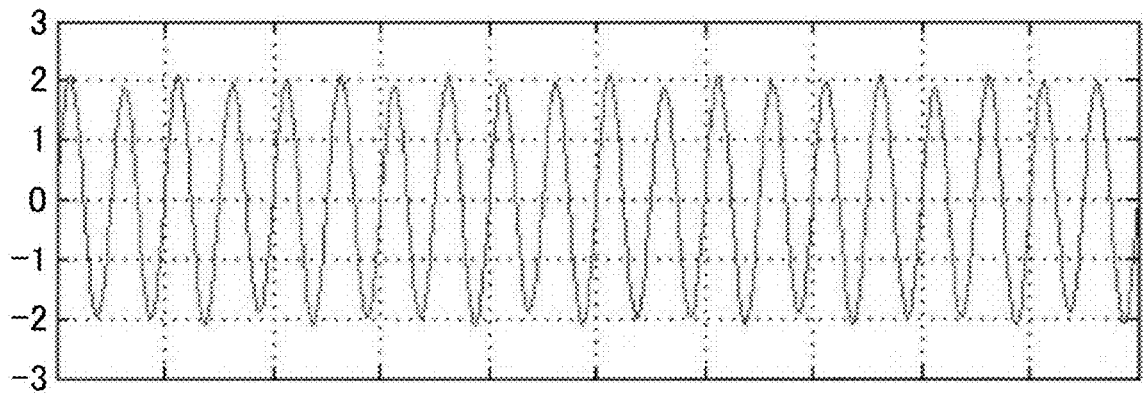
FIG. 5 is a drawing illustrating an example of an unclipped composite wave constituted by the target wave and the interference wave.

FIG. 5 is a drawing illustrating an example of an unclipped composite wave constituted by the target wave and the interference wave. When the antenna 2 receives the target wave illustrated in FIG. 3 and also the interference wave illustrated in FIG. 4, the analog signal input into the A-D converter 10 is a composite wave such as that illustrated in FIG. 5. The range of signal amplitudes that the A-D converter 10 can handle is the range from −1 to 1. As such, if such a composite wave is input into the A-D converter 10, a waveform, in which the portions where the amplitude exceeds the range of −1 to 1 are clipped, is output as the digital signal.

Figure 6:
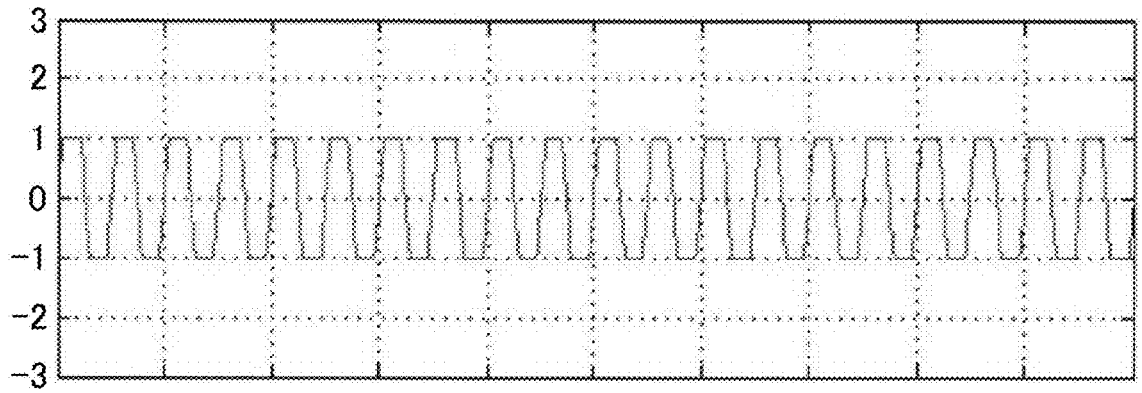
FIG. 6 is a drawing illustrating an example of a clipped composite wave constituted by the target wave and the interference wave.

FIG. 6 is a drawing illustrating an example of a clipped composite wave constituted by the target wave and the interference wave. As illustrated in FIG. 6, the A-D converter 10 outputs a signal in which the portions of the analog signal, of the composite wave, illustrated in FIG. 5, constituted by the target wave and the interference wave, where the amplitude is −1 or less and 1 or greater are clipped.

Figure 7:
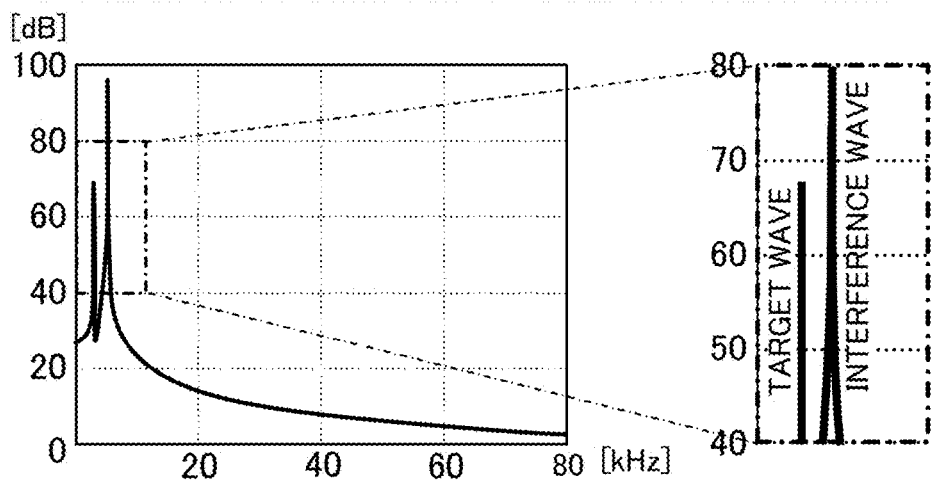
FIG. 7 is a drawing illustrating an example of the frequency spectrum of the unclipped composite wave illustrated in FIG. 5, constituted by the target wave and the interference wave.
Figure 8:
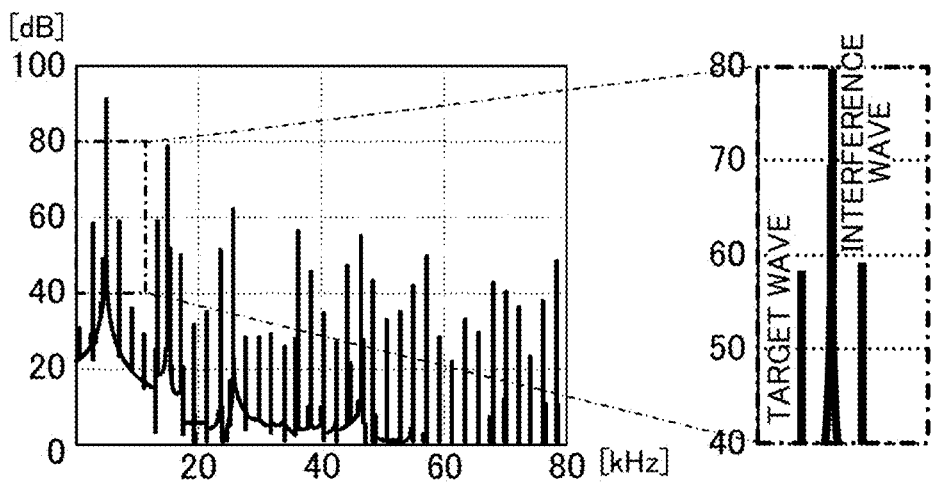
FIG. 8 is a drawing illustrating an example of the frequency spectrum of the clipped composite wave illustrated in FIG. 6, constituted by the target wave and the interference wave.

Changes in the frequency spectrum of the composite wave constituted by the target wave and the interference wave due to being clipped are explained using FIGS. 7 and 8.

FIG. 7 is a drawing illustrating an example of the frequency spectrum of the unclipped composite wave illustrated in FIG. 5, constituted by the target wave and the interference wave. The right section of FIG. 7 is an enlarged drawing of the range indicated by the dot-dash line in the left section. FIG. 8 is a drawing illustrating an example of the frequency spectrum of the clipped composite wave illustrated in FIG. 6, constituted by the target wave and the interference wave. The right section of FIG. 8 is an enlarged drawing of the range indicated by the dot-dash line in the left section. As illustrated in FIG. 7, if the unclipped composite wave constituted by the target wave and the interference wave is converted to a frequency spectrum, a target wave peak and an interference wave exist. As illustrated in FIG. 8, if the clipped composite wave constituted by the target wave and the interference wave is converted to a frequency spectrum, multiple spectra are produced and the level of the target wave decreases. As such, the controller 20 performs processing on the digital signal that is input from the A-D converter 10 in order to compensate for the level decrease of the target wave.

Returning to FIG. 2, the controller 20 of the signal processing device 1 includes, as functional components, a frequency converter 21, an LPF 22, a rate converter 23, a digital amplifier 24, a counter 25, and an amplification factor adjuster 26. The frequency converter 21 performs frequency conversion on the digital signal input from the A-D converter 10, such that the target wave is near 0 Hz. For example, in a case in which the target wave is 10 kHz, the frequency converter 21 multiplies the digital signal input from the A-D converter 10 by a 10 kHz sine wave signal. As a result, the frequency of the target wave becomes near 0 Hz, and the frequency of the unnecessary signal near 0 Hz increases to near 10 kHz. The LPF 22 removes the unnecessary high frequency components of the digital signal that was subjected to frequency conversion by the frequency converter 21. As a result, the unnecessary frequency converted components and, also, the frequency components generated by the clipping are removed. The LPF 22 is an example of a filter. The filter is not limited to a low pass filter and may be any filter capable of removing the unnecessary signal components. The rate converter 23 outputs a value for each of N samples of the digital signal, from which the unnecessary high frequency components have been removed by the LPF 22, and converts the sampling rate of the A-D converter 10 to 1/N-times. Hereinafter N is referred to as an "adjustment cycle." The digital amplifier 24 amplifies the digital signal, for which the rate converter 23 has converted the sampling rate to 1/N-times, and outputs the amplified digital signal to the D-A converter 3.

The counter 25 calculates, for the digital signal input from the A-D converter 10, a number of clipped samples C for each predetermined number of period samples P. Specifically, the counter 25 remembers the upper limit and the lower limit of the A-D converter 10, counts the number of times the upper limit is reached and the number of times the lower limit is reached, and calculates these as the number of clipped samples C. The amplification factor adjuster 26 includes an amplification rate adjustment coefficient table that indicates the amplification factor adjustment coefficient that corresponds to the number of clipped samples C.

FIG. 9 is a drawing illustrating an example of the amplification factor adjustment coefficient table. In the example of FIG. 9, the number of period samples is 50. As illustrated in FIG. 9, the amplification factor adjustment coefficient is a value obtained by dividing the number of period samples P by the number of unclipped regular samples R. The number of regular samples R is a value obtained by subtracting the number of clipped samples C from the number of period samples 50. Each time the counter 25 calculates the number of clipped samples C, the amplification factor adjuster 26 references the amplification factor adjustment coefficient table and multiplies a preset amplification factor α of the digital amplifier 24 by the amplification factor adjustment coefficient, thereby adjusting the amplification factor of the digital amplifier 24. That is, the digital amplifier 24 amplifies the digital signal by the amplification factor α× amplification factor adjustment coefficient. In cases in which the analog signal is not clipped at all, the amplification factor adjustment coefficient is 1 and, as such, the digital amplifier 24 amplifies the digital signal by the preset amplification factor α. Note that a configuration is possible in which, each time the counter 25 calculates the number of clipped samples C, the amplification factor adjuster 26 calculates the amplification factor adjustment coefficient by dividing the number of period samples P by the number of regular samples R. Next, the processing performed by the controller 20 is described in detail while referencing FIG. 10.

Figure 10:
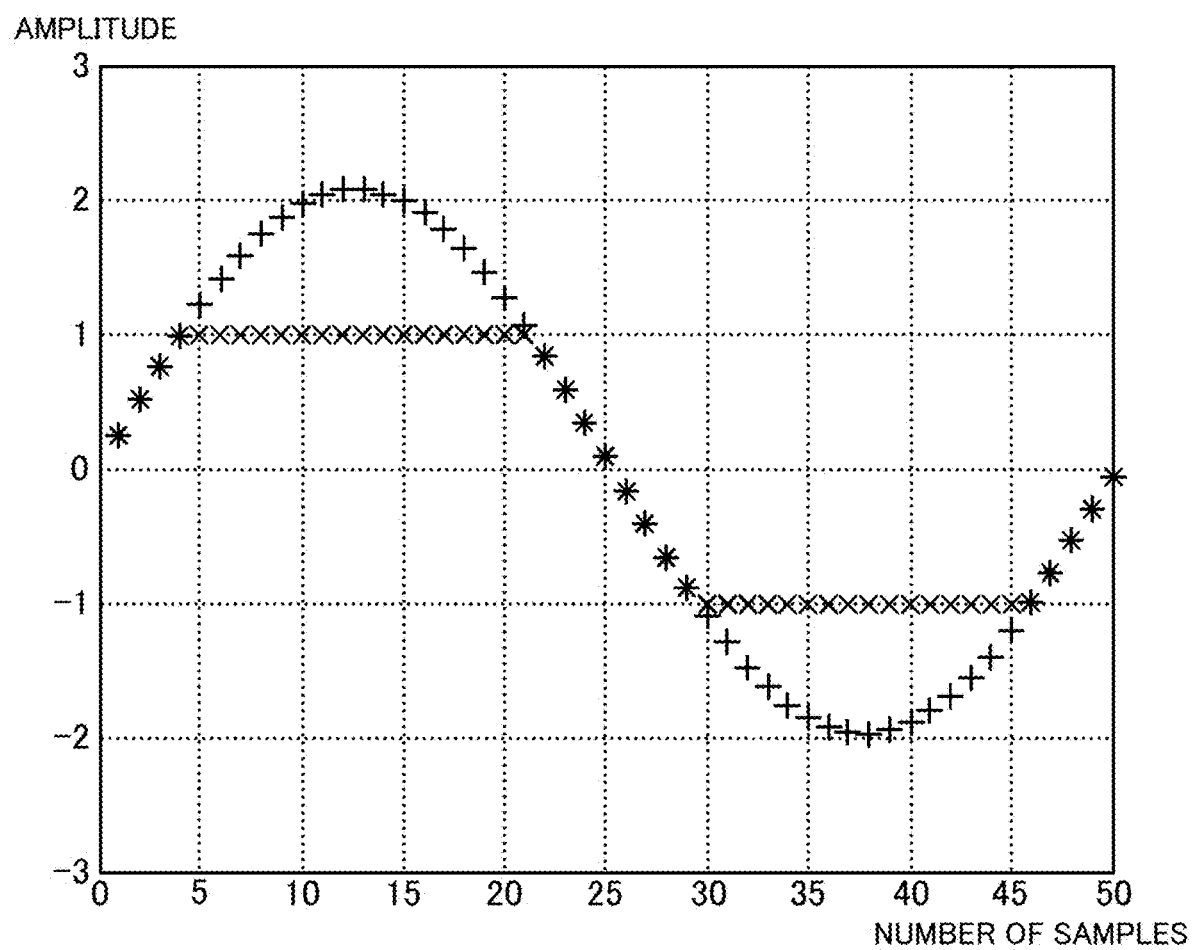
FIG. 10 is a drawing illustrating a digital signal, of a number of period samples, of the composite waves (illustrated in FIGS. 5 and 6) constituted by the target wave and the interference wave, before and after clipping.

FIG. 10 is a drawing illustrating a digital signal, of a number of period samples, of the composite waves (illustrated in FIGS. 5 and 6) constituted by the target wave and the interference wave, before and after clipping. In FIG. 10, the unclipped digital signal of the composite wave constituted by the target wave and the interference wave is indicated by the "+" symbol, and the clipped digital signal of the composite wave constituted by the target wave and the interference wave is indicated by the "×" symbol. For the sake of convenience, the unclipped digital signal is depicted, but the digital signal that is actually input into the counter 25 is the clipped digital signal. As illustrated in FIG. 10, the number of period samples P is 50 and the number of clipped samples C is 33. In this case, when referencing the amplification factor adjustment coefficient table of FIG. 9, the amplification factor adjustment coefficient is 50/17. The amplification factor adjuster 26 multiplies the preset amplification factor α of the digital amplifier 24 by 50/17 to adjust the amplification factor of the digital amplifier 24. When ×50/17 is converted to decibels (dB), $20 \log_{10}(50/17)=9.7$ dB. This is substantially the same level decrease of the target wave that is illustrated in FIGS. 7 and 8. Thus, the controller 20 compensates for the level decrease of the target wave.

The digital amplifier 24 amplifies the digital signal by the α×50/17 amplification factor adjusted by the amplification factor adjuster 26, and outputs the resulting digital signal to the D-A converter 3. The number of period samples P is an integral multiple of the adjustment cycle N. For example, in a case in which the number of period samples P is twice the adjustment cycle N, the amplification factor adjuster 26 adjusts the amplification factor of the digital amplifier 24 every two times the rate converter 23 performs the processing of converting the sampling rate to 1/N-times. In a case in which the number of period samples P is one-times the adjustment cycle N, that is, when the rate converter 23 converts the sampling rate 1/P-times, the processing becomes simple and the level decrease of the target wave is compensated for with greater precision.

Figure 11:
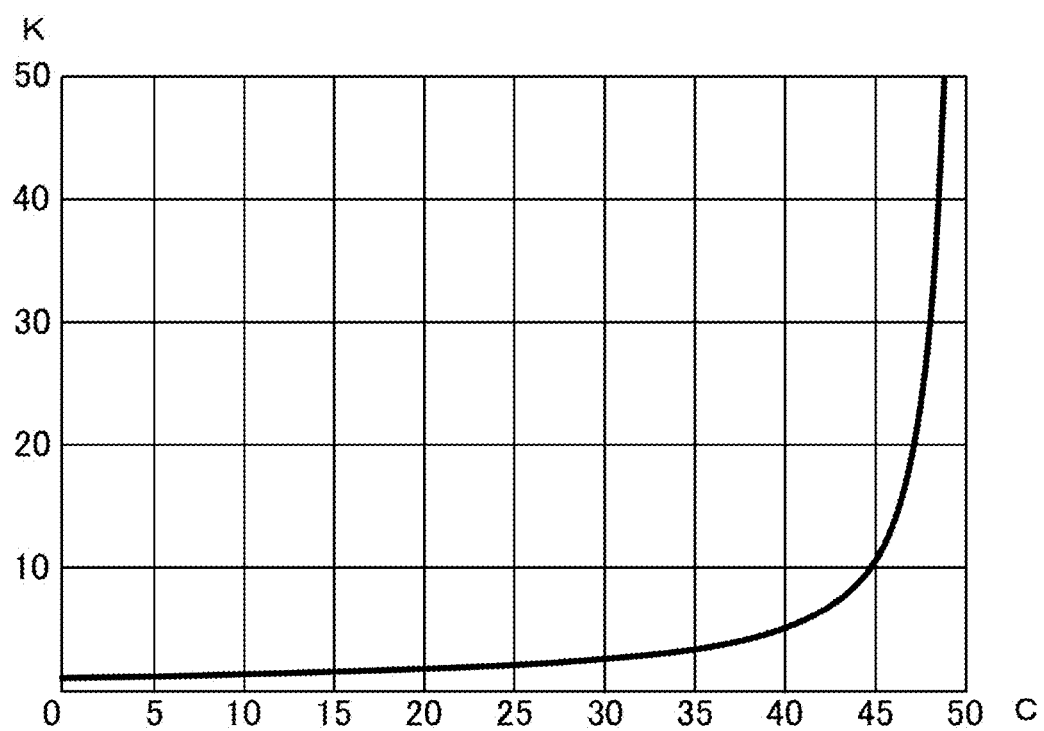
FIG. 11 is a graph illustrating the relationship between the amplification factor adjustment coefficient and the number of clipped samples.

FIG. 11 is a graph illustrating the relationship between the number of clipped samples C and the value k obtained by dividing the number of period samples P by the number of regular samples R. As illustrated in FIG. 11, when the number of clipped samples C increases, the value k obtained by dividing the number of period samples P by the number of regular samples R increases rapidly. As such, the value k may be set as the amplification factor adjustment coefficient when the value k is less than a threshold, and the threshold may be set as the amplification factor adjustment coefficient when the value k is greater than or equal to this threshold. In such a case, for example, the threshold is recorded as the amplification factor adjustment coefficient, of the amplification factor adjustment coefficient table, that corresponds to the number of clipped samples C where the value, obtained by dividing the number of period samples P by the number of regular samples R, is greater than or equal to the threshold. Alternatively, when the value k is greater than or equal to the threshold, a value that gradually increases from the threshold as the value k increases may be used as the amplification factor adjustment coefficient. In such a case, for example, a value that gradually increases from the threshold is recorded as the amplification factor adjustment coefficient, of the amplification factor adjustment coefficient table, that corresponds to the number of clipped samples C where the value, obtained by dividing the number of period samples P by the number of regular samples R, is greater than or equal to the threshold.

As described above, with the signal processing device 1 according to the present embodiment, the amplification factor of the digital amplifier 24 is adjusted on the basis of the ratio of the number of clipped samples C of the signal clipped by the A-D converter 10. As a result, it is possible to compensate for the level decrease of the target wave included in the clipped signal.

The embodiments of the present disclosure are not limited to the embodiments described above. For example, applications of the signal processing device 1 are not limited to transceivers, and the signal processing device 1 can be applied to a device that converts an analog signal to be inputted to a digital signal in which portions having an amplitude that exceeds the predetermined range are clipped, subjects the converted digital signal to frequency conversion and sampling rate conversion, and amplifies the digital signal.

The foregoing describes some example embodiments for explanatory purposes. Although the foregoing discussion has presented specific embodiments, persons skilled in the art will recognize that changes may be made in form and detail without departing from the broader spirit and scope of the invention. Accordingly, the specification and drawings are to be regarded in an illustrative rather than a restrictive sense. This detailed description, therefore, is not to be taken in a limiting sense, and the scope of the invention is defined only by the included claims, along with the full range of equivalents to which such claims are entitled.

What is claimed is:

1. A signal processing device, comprising:
    an A-D converter that converts an analog signal, that is input into the signal processing device, to a digital signal in which portions where an amplitude exceeds a predetermined range are clipped, and outputs the digital signal; and
    a controller that includes:
    a counter that calculates, for the digital signal output by the A-D converter, a number of clipped samples for each predetermined number of period samples;
    a frequency converter that performs frequency conversion of the digital signal output by the A-D converter;
    a filter that removes unnecessary signal components of the digital signal that is subjected to the frequency conversion by the frequency converter;
    a rate converter that converts a sampling rate of the A-D converter to a sampling rate that is an integer multiple of a value obtained by dividing by the number of period samples;
    a digital amplifier that amplifies the digital signal for which the rate converter has converted the sampling rate, and outputs the digital signal that is amplified; and
    an amplification factor adjuster that multiplies a preset amplification factor of the digital amplifier by an amplification factor adjustment coefficient, based on a ratio of the number of clipped samples to the number of period samples, to adjust the amplification factor of the digital amplifier.

2. The signal processing device according to claim 1, wherein the amplification factor adjuster sets a value obtained by dividing the number of period samples by a number of regular samples that are unclipped as the amplification factor adjustment coefficient.

3. The signal processing device according to claim 1, wherein
    when a value obtained by dividing the number of period samples by a number of regular samples that are unclipped is less than a threshold, the amplification factor adjuster sets, as the amplification factor adjustment coefficient, the value obtained by dividing the number of period samples by the number of regular samples, and
    when the value obtained by dividing the number of period samples by the number of regular samples is greater than or equal to the threshold, the amplification factor adjuster sets the threshold as the amplification factor adjustment coefficient.

4. The signal processing device according to claim 1, wherein
    when a value obtained by dividing the number of period samples by a number of regular samples that are unclipped is less than a threshold, the amplification factor adjuster sets, as the amplification factor adjustment coefficient, the value obtained by dividing the number of period samples by the number of regular samples, and
    when the value obtained by dividing the number of period samples by the number of regular samples is greater than or equal to the threshold, the amplification factor adjuster sets, as the amplification factor adjustment coefficient, a value that gradually increases from the threshold as the value obtained by dividing the number of period samples by the number of regular samples increases.

5. A transceiver, comprising:
    the signal processing device according to claim 1;
    an antenna that receives an analog signal and inputs the analog signal into the signal processing device;
    a D-A converter that converts a digital signal, that is output by the signal processing device, to an analog signal;
    an analog amplifier that amplifies the analog signal that is converted by the D-A converter; and
    an output device that outputs the analog signal that is amplified by the analog amplifier.

6. A transceiver, comprising:
    the signal processing device according to claim 2;
    an antenna that receives an analog signal and inputs the analog signal into the signal processing device;
    a D-A converter that converts a digital signal, that is output by the signal processing device, to an analog signal;

an analog amplifier that amplifies the analog signal that is converted by the D-A converter; and an output device that outputs the analog signal that is amplified by the analog amplifier.

7. A transceiver, comprising:

the signal processing device according to claim 3;

an antenna that receives an analog signal and inputs the analog signal into the signal processing device;

a D-A converter that converts a digital signal, that is output by the signal processing device, to an analog signal;

an analog amplifier that amplifies the analog signal that is converted by the D-A converter; and an output device that outputs the analog signal that is amplified by the analog amplifier.

8. A transceiver, comprising:

the signal processing device according to claim 4;

an antenna that receives an analog signal and inputs the analog signal into the signal processing device;

a D-A converter that converts a digital signal, that is output by the signal processing device, to an analog signal;

an analog amplifier that amplifies the analog signal that is converted by the D-A converter; and an output device that outputs the analog signal that is amplified by the analog amplifier.

\* \* \* \* \*